(12) United States Patent
Ihs et al.

(10) Patent No.: US 6,448,754 B1
(45) Date of Patent: Sep. 10, 2002

(54) BIST METHOD FOR TESTING CUT-OFF FREQUENCY OF LOW-PASS FILTERS

(75) Inventors: Hassan Ihs, Sacramento; Susumu Hara, Gold River, both of CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 09/670,306

(22) Filed: Sep. 26, 2000

(51) Int. Cl.[7] ................................................ G01R 23/16
(52) U.S. Cl. .................. 324/76.22; 324/76.82; 324/602; 341/140
(58) Field of Search .................. 324/76.22, 83 R, 324/602, 76.82, 76.47, 75.55, 85, 128, 130, 236, 601, 620; 702/124; 455/226; 341/143, 118, 120, 140; 327/231

(56) References Cited

U.S. PATENT DOCUMENTS 3,961,255 A * 6/1976 Hekimian ..................... 324/76
5,289,500 A * 2/1994 Kiyoharu ..................... 375/224
5,555,452 A * 9/1996 Callaway ..................... 455/226
5,621,408 A * 4/1997 Cake ........................... 341/143

* cited by examiner

Primary Examiner—Michael Sherry
Assistant Examiner—Trung Q. Nguyen
(74) Attorney, Agent, or Firm—Blakely, Sokoloff, Taylor & Zafman LLP

(57) ABSTRACT

A method and circuitry for implementing a built-in self test (BIST) for determining the frequency characteristics of filter circuits in mixed-signal integrated circuits (ICs). The method comprises inserting a Circuit Under Test (CUT) into a feedback loop that looks like a sigma delta modulation loop and adjust the feedback loop so that it oscillates at the cut-off frequency of the filter. The frequency of oscillation can then easily be measured using either on on-chip counter or digital automated testing equipment. The feedback loop preferably comprises a comparator, a phase-delay component, such as a delay-line, and a one-bit DAC (digital-to-analog converter), wherein the comparator is connected to the output of the CUT, and the output of the one-bit DAC is connected to the input of the CUT. The phase delay of the feedback loop can be tuned through adjustment of the delay-line (e.g., an n-length shift register) until an oscillation frequency is obtained. In the case of low-pass filters circuits, the tuned frequency of oscillation corresponds to the cut-off frequency of the CUT.

19 Claims, 1 Drawing Sheet

BIST METHOD FOR TESTING CUT-OFF FREQUENCY OF LOW-PASS FILTERS

BACKGROUND OF THE INVENTION

1. Field of the Invention

The present invention generally concerns measuring circuit characteristics of filters, and in more particular concerns built-in testing schemes for measuring the cut-off frequency of low-pass filters.

2. Background Information

Low pass filters are used in many applications where out of band components of a signal or noise have to be rejected. In many instances, they are implemented in mixed signal integrated circuits (ICs); such ICs are used extensively in telecommunications for pulse templating. For example, the transmitter in typical HDSL transceivers comprises a sigma delta digital-to-analog modulator followed by a large switched capacitor noise-shaping filter. In many cases, the bandwidth of the filter has to be measured to comply with template specifications. This requires the cut-off frequency of the filter to be measured.

Testing mixed signal ICs is known to be a difficult and time consuming task. A conventional test that is often used for testing the cut-off frequency of filters in mixed IC devices uses a multi-tone signal with a tone at the cut-off frequency and other tones at each side of cut-off frequency. During testing, the output signal of the device is digitized, and data processing is performed to extract the gains at each tone. In many cases, to ensure the compliance with different standards, the filter bandwidth of such ICs is programmable. Accordingly, when using the foregoing conventional testing method, a separate test must be performed for each bandwidth setting, leading to long production test times and expense. In addition, conventional test schemes often require connecting the circuit under test (CUT) to complex and expensive mixed-signal automated test equipment.

Ideally, it would be desirable to provide a test scheme for measuring the cut-off frequency of a low pass filter that is both fast and simple. Additionally, such a scheme should be implemented on-chip such that only a limited amount of automated testing equipment (ATE) is required, preferably requiring only digital ATE.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention comprises a method and circuitry for implementing a built-in self test (BIST) for determining the cut-off frequency of low-pass filters. The method comprises inserting a Circuit Under Test (CUT) into a feedback loop that looks like a sigma delta modulation loop and adjust the feedback loop so that it oscillates at the cut-off frequency of the filter. The frequency of oscillation can then easily be measured using either on on-chip counter or digital automated testing equipment.

Figure 1:
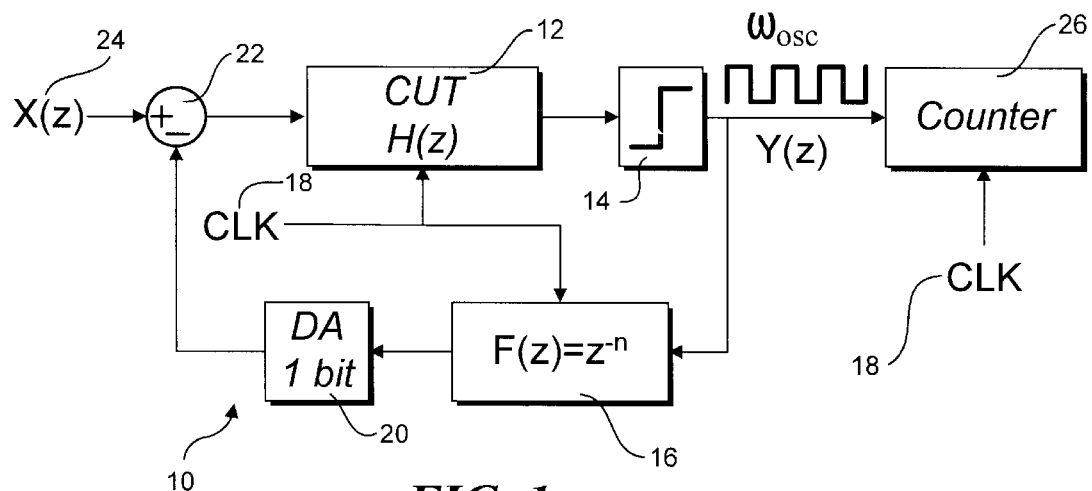
FIG. 1 is a block schematic diagram of exemplary implementation of the present invention.

A block diagram 10 corresponding to an exemplary implementation of such a feedback loop is depicted in FIG. 1, comprising a CUT 12, a comparator 14, which can be as simple as a CMOS inverter, a digital delay line 16 that delays the comparator output signal with delay units corresponding to a clock period produced by a CLK signal 18, and a one-bit Digital-to-Analog Converter (DAC) 20 that limits the signal not to exceed the input voltage range of the CUT. The output from one-bit DAC 20 is fed back into the loop at a summing block 22, which also receives a X(z) input signal 24 that preferably should be zero (i.e. the middle range voltage in between the two voltage levels of one-bit DAC 20). Note that in FIG. 2, this input signal is omitted, which is equivalent to a zero input. The feedback loop is designed so as to make the whole loop oscillate at the same frequency as the cut-off frequency of the CUT. The oscillation frequency or period constitutes the CUT test signature, which preferably is measured using an on-chip counter 26. Optionally, the oscillation frequency can be measured by external digital ATE device. Note that the CUT may be a discrete time circuit, as well as a continuous time circuit.

Figure 2:
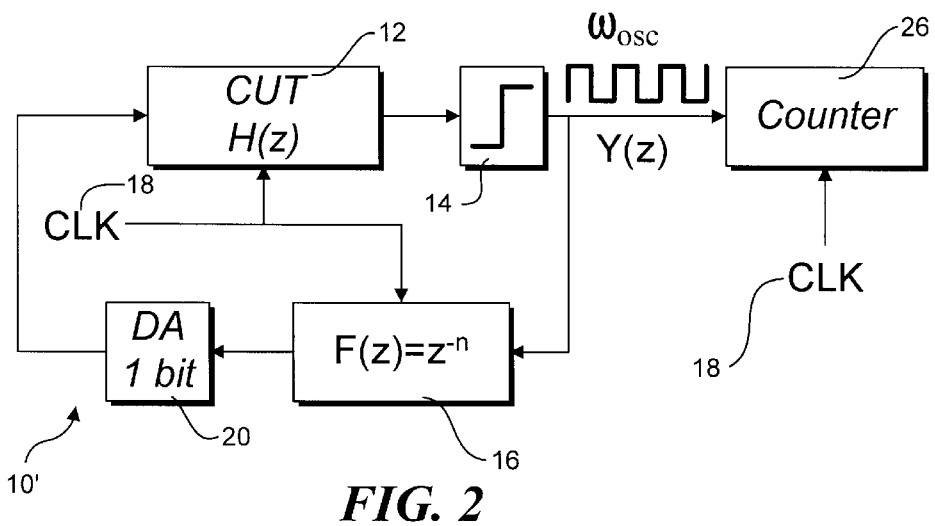
FIG. 2 is a block schematic diagram of an alternate implementation of the present invention.

An optional configuration 10' for the circuit is shown in FIG. 2, wherein components with like-named references perform similar functions to those shown in FIG. 1 and discussed above. In configuration 10', the output of one-bit DAC 20 is simply feed directly into CUT 12 to form the feedback loop. It is noted that care must be taken when implementing this configuration so that a positive feedback is provided, otherwise the loop may become unstable.

The condition of oscillation in any linear circuit is given by Barkausen criterion:

$$|HF|=1 \quad (1)$$

$$\phi_{HF}=2n\pi \quad (2)$$

wherein H is the gain of the CUT, F, the gain of the feedback loop, and $\phi_{HF}$ the total phase of the loop. For the case of the FIG. 1 scheme, the loop is non-linear, and the Barkausen criterion can no longer be applied directly. However, as with sigma delta modulation, the comparator acts as a voltage-controlled gain circuit that adapts the gain of the loop such that it is maintained at unity at all times. Although no well-established theory expressing the gain of the comparator exists, the Barkausen condition on gain can be written using a conceptual representation of the comparator gain, as follows:

$$|HFG_{comp}|=1 \quad (3)$$

wherein $G_{comp}$ is the voltage dependant gain of the comparator. The comparator (a sine function) can be seen as a square wave regenerative circuit. This means that, in an open loop, applying a square wave at the CUT input will result in a distorted signal at its output, but regenerated with a phase shift at the comparator output. Since the comparator regenerates the input square wave, the condition on the gain is always satisfied. As a result, the oscillation of the loop depends only on the Barkausen condition on the phase.

Assume F(z) is a constant. To satisfy the Barkausen criterion on phase, the phase in the whole loop should be $-2\pi$. As the signal inversion after the output of one-bit DAC 20 introduces $-\pi$ phase shift, the CUT is required to contribute $-\pi$ phase. Since every pole of the CUT is contributing a phase maximum of $-\pi/2$, the oscillation frequency should be larger than the second pole of the CUT, which in turn is larger than its cut-off frequency. The role of the F(z) delay line is to add more phase shift into the loop so as to adjust the oscillation frequency to the cut-off frequency. As the loop oscillates at the attenuated region of the CUT transfer function, the odd harmonics of the square wave present at its input are filtered out. This means that the effect of signal non-linearity on the phase can be neglected. The Barkausen condition on the phase can then be written:

$$\phi H(W_{OSC}) - nT_{OSC} = -\pi \quad (4)$$

wherein $\phi_{HF}$ is the phase transfer function of the CUT, T is the clock frequency, and nT is the delay in the delay line. The role of this equation is to extract the number of delay units n in the delay line that will make the loop oscillate at the CUT's cut-off frequency. For large discrete filters, this equation may be difficult to solve analytically. Simulation using a simple behavioral modeling of the CUT allows to tune the oscillation frequency. Generally, it takes no more than 10 delay units to set the oscillation frequency to the desired value.

The method works in the following manner. The delay line is adjusted until either a predetermined frequency of oscillation should be produced or a frequency of oscillation corresponding to the cut-off frequency of the CUT is reached through tuning the phase delay of the feedback loop. In the both cases, the on-chip counter can be used to determined if the frequency of oscillation does not correspond to the cut-off frequency of the CUT. Accordingly, in the second case the phase delay in the delay line can be adjusted until the loop is tuned, whereupon the cut-off frequency will then be known. The first case would be used in situations where a predetermined frequency characteristic of the CUT is desired, whereby if the difference between the oscillation frequency and the CUT frequency characteristic exceeds a threshold, the CUT is deemed to not meet the predetermined frequency characteristic. For example, a particular mixed-signal IC may need to have a low-pass filter with a cut-off frequency of 10 KHz ±5%. If the difference between the oscillation frequency and the CUT frequency characteristic was determined to exceed 5%, then the CUT would not qualify for acceptance.

The foregoing scheme provides many advantages over the prior art. Notably, it primarily uses digital blocks for the feedback implementation. It is also substantially immune against process and temperature variations. As with sigma delta loops, the offset in the comparator input doesn't affect the oscillation frequency. As a result, the comparator can be as simple as a CMOS inverter. In addition, digital delay line 16 may comprise an n-length shift register or an $n=2^P$ counter.

As discussed above, one-bit DAC 20 limits the input voltage in the CUT so as not to exceed its linear input voltage range, thereby eliminating the generation of undesired signal distortions. One-bit DAC 20 may comprise a few switches and a voltage reference, which is readily available on most mixed-signal ICs. Similar implementations may be used with switched-capacitor and switched-current circuits.

The method of the present invention is applicable to an array of communication circuits, as well as other mixed-signal circuits that employ filter elements. The method can be used with both continuous and discrete time filters. It can be used in sigma-delta digital-to-analog filters to check the noise-shaping bandwidth. It may also be applied to the Automated Gain Controller (AGC)-Equalizer pairs used as the analog front end in many communication applications. In this case, the AGC can be configured using some minor modifications so as to play the role of one-bit DAC 20. In addition, the method is not restricted to low-pass filters.

Other pole/zero related parameters can be determined in any type of filter using the same scheme.

The method is substantially faster than the traditional multi-tone test presently used to determine the cut-off frequency of filters. Under the method, circuit characteristics can be obtained by using a Test Access Port (TAP) controller, which is generally available for testing most ICs. This eliminates the time required to set up GPIB interfaces and external AWGs and digitizers, as well as reducing the processing time.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Accordingly, it is not intended that the scope of the invention in any way be limited by the above description, but instead be determined entirely by reference to the claims that follow.

What is claimed is:

1. A method for determining a frequency characteristic of a filter circuit embedded in an integrated circuit (IC), comprising:

providing a plurality of digital components embedded on the IC corresponding to digital blocks in a feedback loop;

connecting the filter circuit to the plurality of digital components embedded on the IC such that the filter circuit is inserted into the feedback loop;

adjusting a frequency of oscillation of the feedback loop until the feedback loop is tuned; and determining the frequency of oscillation when the feedback loop is tuned, said frequency corresponding to the frequency characteristic of the filter circuit.

2. The method of claim 1, further comprising measuring the oscillation frequency as the feedback loop is tuned to produce a test signature of the filter circuit.

3. The method of claim 1, wherein said plurality of digital components comprise:

a comparator;

a delay component; and a signal limiting component.

4. The method of claim 3, wherein the delay component comprises an n-length shift register.

5. The method of claim 3, wherein the delay component comprises an $n=2^P$ counter.

6. The method of claim 3, wherein the signal limiting component comprises a one-bit digital-to-analog converter (DAC).

7. The method of claim 3, wherein the comparator comprises a CMOS inverter.

8. The method of claim 1, wherein the frequency of the feedback loop is measured with a counter embedded in the IC.

9. The method of claim 1, wherein the filter circuit corresponds to a low-pass filter and the frequency characteristic is the cut-off frequency of the low-pass filter.

10. A method for determining a cut-off frequency of a filter circuit embedded in a mixed-signal integrated circuit (IC), comprising:

inserting the filter circuit into a feedback loop comprising a comparator, a delay component, and a one-bit digital-to-analog converter that are embedded on the IC;

tuning a frequency of oscillation of the feedback loop by adjusting the delay component to control a phase delay in the feedback loop; and determining the frequency of oscillation when the loop is tuned, said frequency corresponding to the cut-off frequency of the filter circuit.

11. The method of claim 10, wherein the delay component comprises an n-length shift register.

12. The method of claim 10, wherein the delay component comprises an n=$2^P$ counter.

13. The method of claim 10, wherein the frequency of the feedback loop is measured with a counter embedded in the IC.

14. The method of claim 10, wherein the comparator comprises a CMOS inverter.

15. A mixed-signal integrated circuit (IC) comprising;
    filter circuitry having an input and an output inserted into a feedback loop including;
        a comparator having an input connected to the output of the filter circuitry and an output;
        a phase-delay component having an input connected to the output of the comparator and an output;
        a one-bit digital-to-analog converter (DAC) having an input connected to the output of the phase-delay component and an output connected to the input of the filter circuitry so as to form the feedback loop; and
        a counter connected to the output comparator,
    said feedback loop enabling a frequency characteristic of the filter circuit to be determined through a built-in self-test of the IC.

16. The circuit of claim 15, wherein the phase-delay component comprises an n-length shift register.

17. The circuit of claim 15, wherein the phase-delay component comprises an n=$2^P$ counter.

18. The circuit of claim 15, wherein the comparator comprises a CMOS inverter.

19. The circuit of claim 15, wherein the filter circuitry corresponds to a low-pass filter and the frequency characteristic is the cut-off frequency of the low-pass filter.

* * * * *